US005831656A

United States Patent [19]

Chosa

[11] Patent Number: 5,831,656
[45] Date of Patent: Nov. 3, 1998

[54] COMPACT RECORDING APPARATUS WITH EFFICIENT SPACE UTILIZATION

[75] Inventor: Takashi Chosa, Tokyo, Japan

[73] Assignee: Canon Kabushiki Kaisha, Tokyo, Japan

[21] Appl. No.: 604,544

[22] Filed: Feb. 21, 1996

[30] Foreign Application Priority Data

Feb. 21, 1995 [JP] Japan .................................... 7-031261

[51] Int. Cl.[6] .............................. B41J 29/13; H05K 7/02; H01R 9/09

[52] U.S. Cl. ........................... 347/108; 361/777; 174/261

[58] Field of Search ................................ 347/12, 13, 209, 347/210, 108, 109; 358/296, 400, 502, 503, 300; 361/683, 775, 777, 780, 794; 174/261; D18/55, 56; 400/88

[56] References Cited

U.S. PATENT DOCUMENTS 5,504,505 4/1996 Tamura et al. ............................ 347/13
5,617,122 4/1997 Numata et al. ........................... 347/37
5,710,587 1/1998 Suzuki et al. ........................... 347/104

*Primary Examiner*—N. Le
*Assistant Examiner*—L. Anderson
*Attorney, Agent, or Firm*—Fitzpatrick, Cella, Harper & Scinto

[57] ABSTRACT

A recording apparatus is provided with a carriage that causes a recording head for recording on a recording medium to relatively travel with respect to the recording medium, a mechanism unit for driving the carriage and carrying the recording medium simultaneously, and a power-supply circuit. This recording apparatus includes a slanting portion arranged for the mechanism unit as a passage for carrying the recording medium, and, in a space made available below the slanting portion, the components constituting the power-supply circuit are arranged substantially in line in the direction substantially transverse to the slanting portion of the mechanism unit. With the arrangement of such structure, the efficiency of space utilization is enhanced and the apparatus can be fabricated more compactly, thus attaining the intended miniaturization thereof.

11 Claims, 9 Drawing Sheets

COMPACT RECORDING APPARATUS WITH EFFICIENT SPACE UTILIZATION

BACKGROUND OF THE INVENTION

1. Field of the Invention

The present invention relates to a recording apparatus that records on a recording medium, such as an ink jet recording apparatus and a thermal transfer recording apparatus. More particularly, the invention relates to a small recording apparatus which is light in weight.

2. Related Background Art

As recording methods for a recording apparatus that records on paper, cloth, plastic sheet, OHP sheet, or the like, there have been proposed, among others, a wire-dot type, a thermal sensitive type, a thermal transfer type, and an ink jet recording type, for example. Such recording apparatus is structured to be able to mount a recording head on it, to which either one of these recording types is applicable.

Now, of those recording apparatuses, the description will be made of the one capable of performing non-impact recording at low noises by exemplifying a recording apparatus (ink jet recording apparatus) that records by use of a recording head of ink jet recording type (ink jet recording head) for recording on a recording medium by discharging ink from the discharge ports (nozzles) of the head by the means of recording elements adopted for generating energy to be utilized for discharging ink.

The ink jet recording apparatus is capable of recording in high density at high speeds. Also, this type of apparatus can be fabricated compactly. Its running costs are low, while it is made easy to record color images by use of multiple color ink. Among such apparatuses, a line type ink jet recording apparatus that uses recording means of a line type makes a more enhanced recording speed possible by use of many numbers of discharge ports arranged in the width direction of a recording medium.

Because of these advantages, the ink jet recording apparatus is on the market widely as a printer adopted for the output device of information processing systems such as a copying machine, facsimile apparatus, electronic typewriter, word processor, work station, or utilized as a hand-held or a portable printer provided for a personal computer, a host computer, an optical disc device, a video apparatus, or the like.

Although an ink jet recording apparatus is structured in accordance with the required functions, specifications, and the modes typical of the system to which such apparatus is applicable, it is generally practiced that the ink jet recording apparatus is provided with a recording head, a carriage having an ink tank mounted on it, feeding means for carrying a recording medium, and means for controlling them. Then, the recording head provided with a plurality of discharge ports for discharging ink is used to serially scan in the direction (main scanning direction) rectangular to the direction in which a recording medium is carried (sub-scanning direction), while discharging ink droplets from the discharge ports in accordance with recording signals. On the other hand, the recording medium is intermittently fed (pitch fed) for an amount equal to the recording width during non-recording period. In this way, the recording is made on the recording medium. At this juncture, by use of the recording head where a plurality of discharge ports are arranged on a straight line that extends in the sub-scanning direction, it is possible to perform a recording equivalent to the width (recording width) that corresponds to the number of nozzles (arrangement width of nozzles) just by one scanning of the recording head on the recording medium.

As the recording elements of an ink jet recording apparatus, that is, elements for generating thermal energy utilized for discharging ink, there are, among others, those which use transducing elements such as piezoelectric elements to effectuate mechanical transformation when a voltage is applied; those which discharge ink by the function of heat being generated by the irradiation of electromagnetic wave such as laser; or those which give heat to liquid by means of electrothermal transducing elements provided with heating resistors.

Of the elements described above, the ink jet recording head of a type that discharges ink by the utilization of thermal energy is capable of recording in high resolution, because it is possible for this type of the head to arrange ink discharge ports in high density. Particularly, the recording head that uses electrothermal transducing elements as energy generating elements can be fabricated compactly. Also, when assembling such elements in high density, it is possible to fully apply the advantages of IC technology and micro-machining technique whose advancement and enhancement of reliability are significant in the semiconductor industry in recent years. The costs of manufacture are also low for this type of head, among other advantages that it can provide.

Now, there are many apparatuses for which miniaturization has been intended by making the most of such characteristics as described above for the recording apparatuses represented by an ink jet recording apparatus. FIG. 7 is a perspective view which shows one example of the conventional small recording apparatus. This recording apparatus 70 is such that a tray 71 is attached thereto for receiving each medium to be exhausted after recording. On the front side thereof toward the operator, an operation unit 73 is arranged with operating switches, indication elements, and others. The mechanism portion where the recording head and others is mounted are covered by a lower case 75 and an upper case 76. In FIG. 7, almost no mechanical portion is shown. In this respect, a cover 72 is provided for the portion of the upper case 76 where a carriage is arranged. When recording is performed by use of this recording apparatus, a separately prepared sheet feeder (not shown) is coupled to the rear side of the apparatus shown in FIG. 7. The recording apparatus 70 is arranged so that the operation unit 73 faces upward, and then, the recording medium is supplied from the sheet feeder one after another (that is, the sheet feeding is performed in this way). After that, the recording medium is carried by means of a platen, rollers 74, and others, while a recording head, such as an ink jet recording head, is being caused to scan for recording. Thus the recorded medium is exhausted onto the tray 71.

FIG. 8 is a perspective view which shows a state that the cover 72 is removed from the portion where the carriage is arranged. In FIG. 8, the carriage 92 without any recording head being mounted on it, and a lead screw 79 are observable. The lead screw is provided for the carriage 92 to travel. Here, a back plate 78 is attached to the cover 72.

FIG. 9 is a perspective view which shows a state that the upper case 76 is removed entirely. FIG. 10 is a perspective view which shows a state that a base board 91 for controller is also removed. FIG. 9 and FIG. 10 illustrate the base board 91 for controller where electric circuits are arranged for controlling this recording apparatus 70, as well as the mechanism unit 93 for operating the recording medium and carriage 92. The carriage 92 is driven by the mechanism unit

93 to scan in the directions indicated by arrows in FIG. 9. On the base board 91 for controller, there are provided the IC 102 in which the peripheral circuits and other circuits required for the operation of a CPU 101 are arranged on one chip; switches 103; LEDs 104; a connector 105 for receiving recording signals from the outside, and the like, in addition to the one-chip CPU (central processing unit) 101 as the so-called one chip microprocessor. Also, on the board, the components required for controlling elements, performing indications, and others are installed. These components are connected by means of wiring patterns on the board, respectively. Here, the switches 103 and LEDs 104 are arranged on the board in the respective positions corresponding to those on the operation unit 73. This base board 91 for controller is fixed to the inner face of the lower case 75 by means of screws 95.

In the area where the carriage 92 passes during its traveling (hereinafter, referred to as a carriage passing area), it is impossible to arrange any components and members because any collision should be avoided between the carriage 92 and any one of them when the carriage scans. In the conventional recording apparatus 70, the base board 91 for controller, the carriage passing area, and the mechanism unit 93 are compactly arranged in parallel on the bottom portion of the recording apparatus unit, thus having attained making the apparatus smaller to a certain extent. Here, however, if a continuous recording is required, the continuous sheet feeding should be arranged for this recording apparatus. In other words, a separately prepared autosheet feeder should be coupled to the rear side of the apparatus shown in FIG. 8, that is, the back side of the lower case 75 thereof. Therefore, the entire size of the apparatus becomes slightly larger than that of the apparatus shown in FIG. 7 to FIG. 10.

In recent years, there have been more occasions that a recording apparatus is carried around for use in order to meet the requirements of the high information society. The demands on an easily portable recording apparatus are intensified, and it is more desired to implement the further miniaturization of the recording apparatus. However, there is automatically a limit to the miniaturization of the conventionally structured recording apparaatus such as described above. It is not easy to attain the miniaturization particularly when the apparatus should be arranged for a continuous sheet feeding, and the provision of an excellent portability is a difficult problem to be solved when the further miniaturization of the apparatus is attempted.

SUMMARY OF THE INVENTION

It is an object of the present invention to provide a small recording apparatus excellent in its portability by attaining the further miniaturization of a recording apparatus.

It is another object of the invention to provide a recording apparatus comprising a carriage that enables a recording head for recording on a recording medium to relatively travel with respect to the recording medium; a mechanism unit for driving the carriage and carrying the recording medium at the same time; and a power-supply circuit, wherein the power-supply circuit can be formed on a printed circuit board by forming a slanting portion for the mechanism unit as a passage to carry the recording medium, and then, in a space made available below the slanting portion, the components that constitute the power-supply circuit are arranged substantially in line in the direction substantially rectangular to the direction of the slanting portion.

It is still another object of the invention to provide a recording apparatus comprising a carriage that enables a recording head for recording on a recording medium to travel relatively with respect to the recording medium; a mechanism unit for driving the carriage and carrying the recording medium at the same time; a base board for controller including a power-supply circuit; and the components constituting the power-supply circuit being arranged on one face of the base board for controller, and being connected to each other by means of wiring pattern at the same time, wherein the mechanism unit is provided with a slanting portion as a passage to carry the recording medium, at least a part of the base board for controller is arranged in the space available below the slanting portion, the components constituting the power-supply circuit are arranged substantially in line in the direction facing such space and also substantially rectangular to the slanting portion, and the width of the wiring pattern between the components constituting the power-supply circuit is defined at the rate of 700 $\mu$m or more per current of 1 A passing the wiring pattern.

DETAILED DESCRIPTION OF THE PREFERRED EMBODIMENTS

Figure 1:
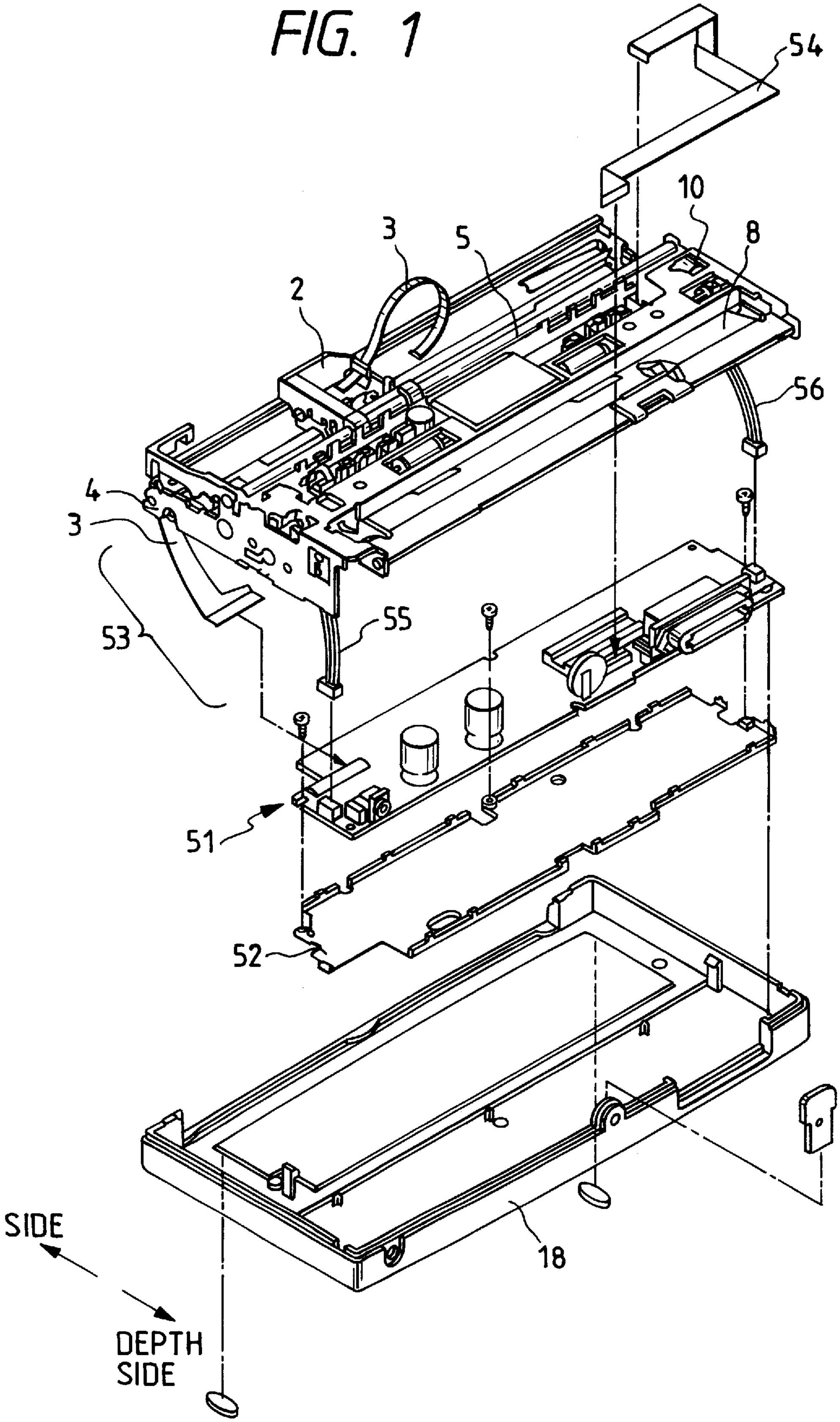
FIG. 1 is a perspective view showing the way in which the mechanism unit and base board for controller are installed on the lower case of an ink jet recording apparatus in accordance with one embodiment of the present invention.
Figure 2:
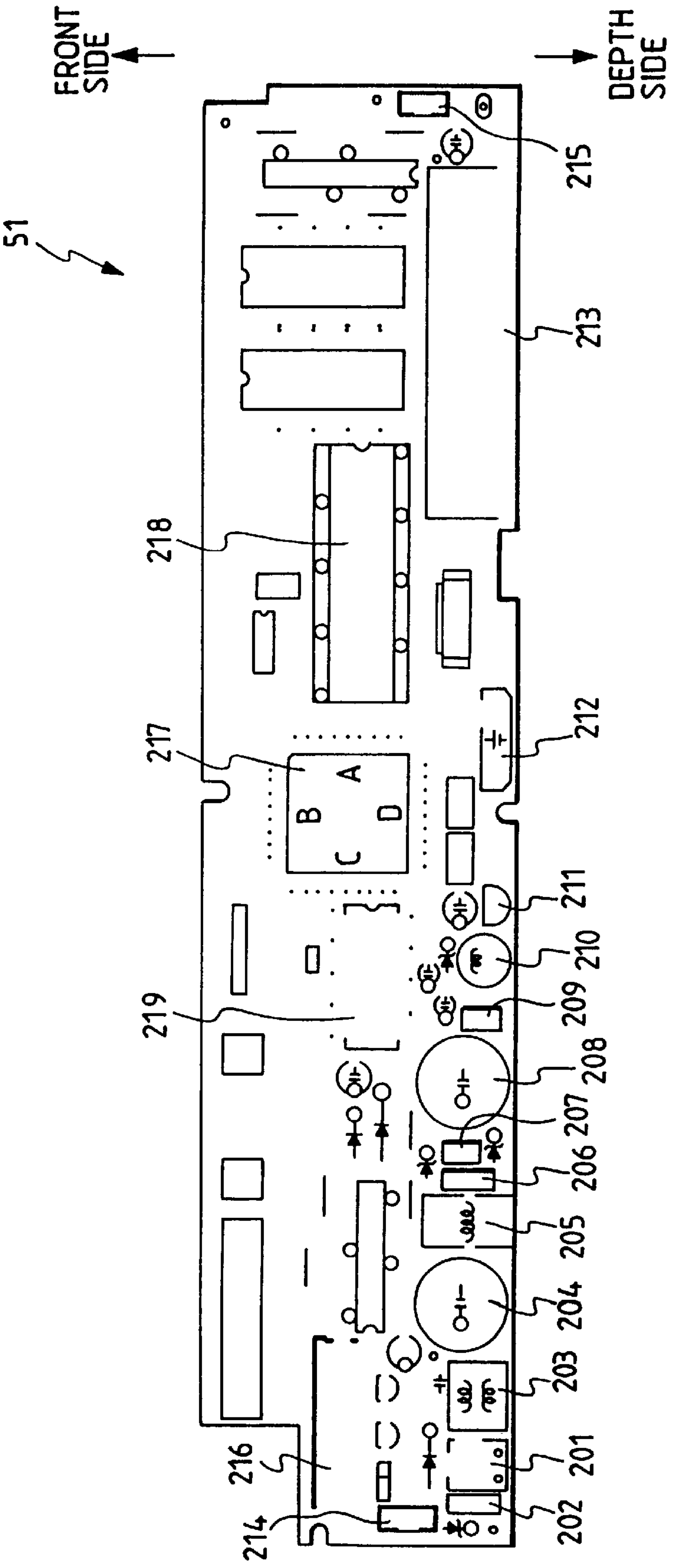
FIG. 2 is a plan view which shows a base board for controller.
Figure 3:
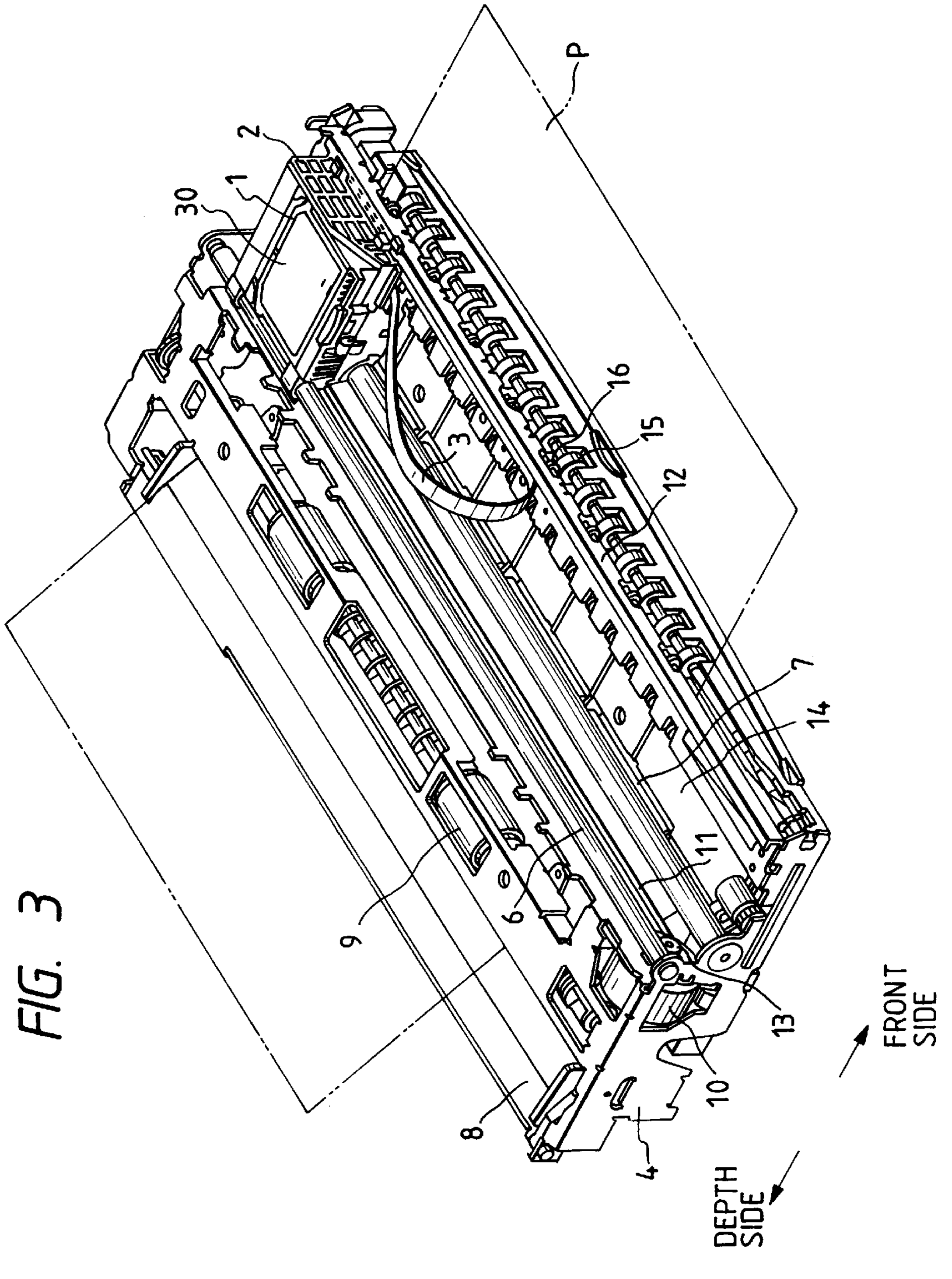
FIG. 3 is a perspective view which shows an ink jet recording apparatus in accordance with one embodiment of the present invention, and which illustrates a state where its housing is removed.
Figure 4:
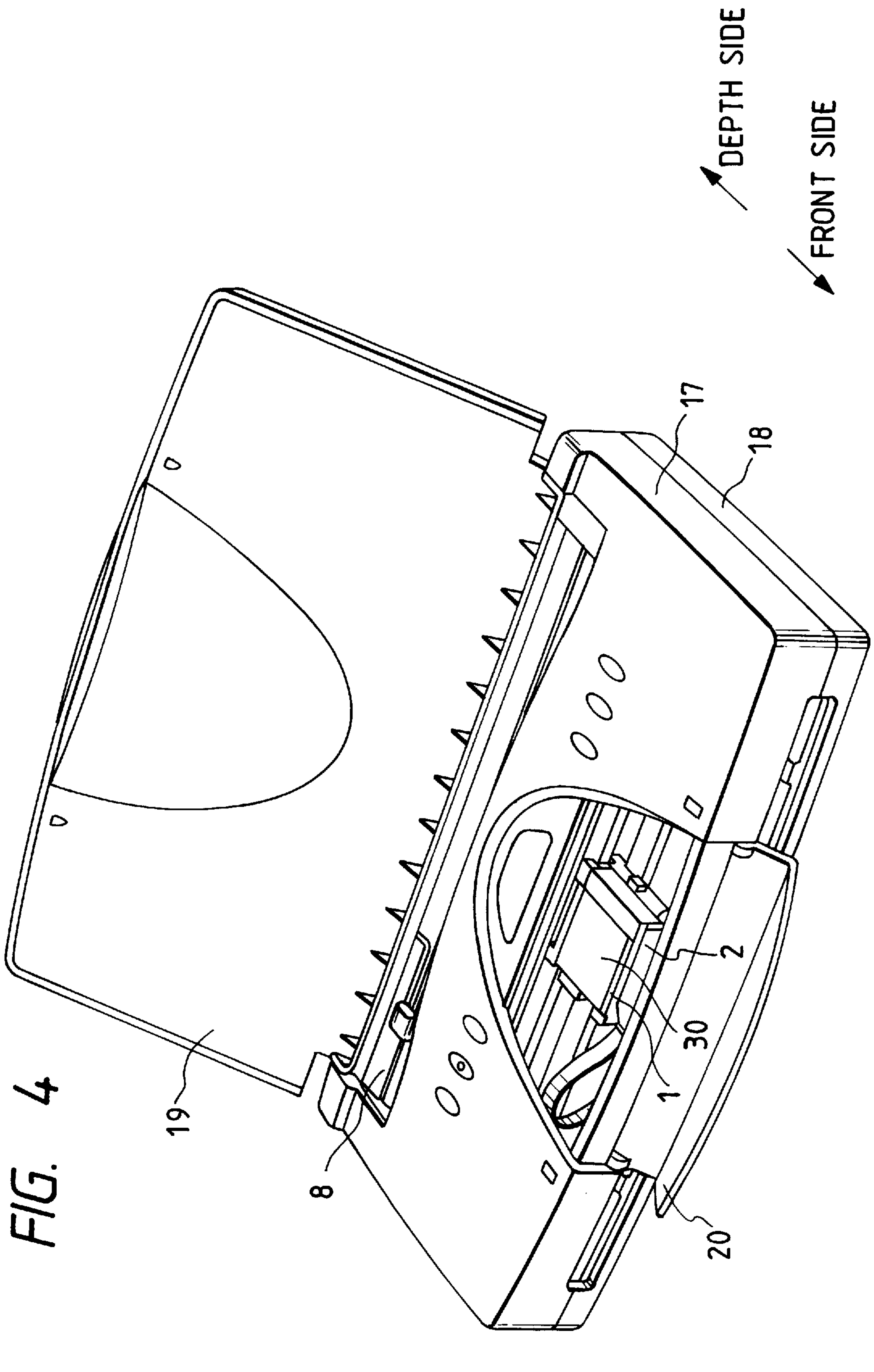
FIG. 4 is a perspective view which shows the ink jet recording apparatus represented in FIG. 3, and illustrates a state where its housing is installed.

Now, with reference to the accompanying drawings, the description will be made of the embodiment in accordance with the present invention. Here, as the example of a recording apparatus, an ink jet recording apparatus will be described. FIG. 1 is a view showing the way in which the mechanism unit and base board for controller are installed on the lower case of an ink jet recording apparatus in accordance with one embodiment of the present invention. FIG. 2 is a plan view which shows the base board for controller. FIG. 3 is a view which shows the ink jet recording apparatus represented in FIG. 3, and which illustrates a state where its housing is removed. FIG. 4 is a view which shows the ink jet recording apparatus represented in FIG. 3, and which illustrates a state that the housing is installed.

A recording apparatus of the kind is provided with a slanting portion for its mechanism unit as a passage to carry a recording medium, and then, a base board for controller is arranged in a space made available below the slanting portion. Therefore, it is possible to utilize the space three-dimensionally for the attainment of the miniaturization of the recording apparatus. Here, the components constituting a power-supply circuit (power-supply circuit components) are generally tall. Therefore, the power-supply circuit components are arranged substantially in line facing the space, and also, in the direction substantially rectangular to the direction of the slanting portion provided as a passage to carry the recording medium. In this way, it is possible to enhance the efficiency of the space utilization for the attainment of the further miniaturization of the recording apparatus.

Also, for the present embodiment, it is possible to use an ink jet recording head as the recording head that discharges ink in accordance with signals. In this case, the recording head can be provided with electrothermal transducing elements to generate thermal energy to be utilized for discharging ink. The recording head can discharge ink from the discharge ports by the utilization of film boiling created in ink by the application of the thermal energy generated by the electrothermal transducing elements.

Also, as another mode of the ink jet recording head, it may be possible to provide electro-mechanical transducing elements such as piezo-elements, and then, discharge ink from the discharge ports by utilizing the mode transformation effectuated by use of the electro-mechanical transducing elements.

For the ink jet recording apparatus of the present embodiment, the base board 51 for controller to which a shielding board 52 is fixed by means of small screws is arranged to be overlapped with the mechanism unit 53 that carries the recording medium and drives the carriage as shown in FIG. 1. Further, as shown in FIG. 2, the arrangement of each circuit component of the base board 51 for controller is devised so as to attain the further miniaturization of the apparatus. Now, at first, in conjunction with FIG. 3, the ink jet recording apparatus will be described in accordance with the present embodiment. In FIG. 3, a carriage 2 is arranged to detachably mount a recording head cartridge 1, and slidably supported by the guide shaft 5 and guide rail 12 fixed to a frame 4 at both ends thereof so as to be arranged in parallel to each other, and also, slidably supported in the direction rectangular to the feeding direction of a recording medium P and in the direction parallel to the plane of the recording medium P as well. Also, the carriage 2 is coupled to one location of a carriage driving belt 11 tensioned around the driving pulley 13 fixed to the output shaft of a carriage driving motor 10 and a rotatively and axially supported free pulley (not shown). With this structure, therefore, the carriage driving belt 11 rotates to allow the carriage 2 to reciprocate in the direction described above when the carriage driving motor 10 is driven.

The recording head cartridge 1 is integrally formed by the recording head unit that discharges ink in accordance with recording signals, and an ink tank 30 that retains ink in it. The cartridge is detachably mountable on the carriage 2. The ink tank 30 may be an exchangeable ink tank that can be attached to or detached from the recording head unit. The recording head unit utilizes the thermal energy generated by electrothermal transducing elements as energy to be used for recording, and discharges ink downward in FIG. 3, thus executing recording on a recording medium P. The recording signals are transmitted from the base board 51 for controller (which will be described later) to the recording head unit through a flexible cable 3 connected to the carriage 2. The flexible cable 3 is arranged in the traveling direction of the carriage 2. Along the traveling of the carriage 2, the cable forms a loop.

FIG. 4 is a view which shows a state where the ink jet recording apparatus represented in FIG. 3 is housed. The housing, that is, the exterior thereof, comprises a lower case 18 and an upper case 17. In the interior of the housing thus arranged, the main body portion of the ink jet recording apparatus described above is installed.

On the depth side of the upper case 17, a top cover 19 is arranged to be freely opened or closed for covering the upper case 17. The upper case 17 is provided with an aperture in a location corresponding to a pressure board 8. When the top cover 19 is opened, the top cover 19 becomes a tray that serves to set the recording medium P on the pressure board 8. Further, the upper case 17 is provided with an aperture beginning at its central portion to the front part. Through this aperture, the recording head cartridge 1 or the ink tank 30 can be attached or detached. Therefore, when a replacement should be made for recording head cartridges 1 or ink tanks 30, the carriage is driven to travel to the central portion of its traveling range by means of a given operation. On the front side of this aperture for use of the replacement of recording head cartridges 1 or ink tanks 30, a head cover 20 is arranged to be freely opened or closed to cover a part of the upper face of the aperture and the front end thereof. The head cover 20 is closed if there is no replacement needed for recording head cartridges 1 or ink tanks 30, thus protecting the recording head cartridge 1 currently in use.

Here, the recording medium P is stacked on the pressure board 8, both ends of which are rotatively supported on the frame 4. The pressure board 8 is biased by a biasing means (not shown) to a pickup roller 9. The recording medium P stacked on the pressure board 8 is pressed to the pickup roller 9. In accordance with a sheet feed command, the pickup roller 9 rotates. Then, by the application of frictional force between the pickup roller 9 and recording medium P, the recording medium P is fed out. Here, the pressure board 8 is provided with separation means (not shown) formed by a separation nail and others such as used for the conventional automatic sheet feeding device. Therefore, even when plural sheets of recording medium P are stacked on the pressure board, only one recording medium P laid on the top of the stack is fed out by the function of this separation means. In other words, with this setup, an automatic sheet feeding function is realized.

The recording medium P fed out by means of the pickup roller 9 is carried downward to a position below the carriage 2, while being pinched by the feed roller 6 whose ends are supported on the frame 4, and a pinch roller 7 installed on the base 14. In this position, recording is made on the recording medium P. Further, on the downstream side of the carriage 2 in the feeding direction of the recording medium P, a sheet exhaust roller (exhausting roller) 15 and a spur 16 are arranged to face each other. The recording medium P having passed below the carriage 2 is pinched by the sheet exhaust roller 15 and spur 16 to be exhausted. The pickup roller 9, feed roller 6, and sheet exhaust roller 15 are driven by a sheet feed (feeding) motor (not shown) as the power source of these rollers.

Here, in the description given below, the upstream side (sheet feeding side) of the recording medium P is defined as depth side, and the end face thereof is defined as back face, while the downstream side (sheet exhausting side) is defined as front side, and the end face thereof is defined as front face. Hence, the recording medium P is being carried from the depth side of the ink jet recording apparatus to the front side thereof.

In accordance with the recording apparatus of the present embodiment, the structural portion on the depth side is in the slanting direction with respect to the bottom face of the apparatus that serves as reference. More specifically, the pressure board 8 is arranged so that the depth side is raised, while the front side is lowered, thus making it possible to arrange the base board 51 for controller in a space thus made available below the pressure board 8. At the same time, it is made possible to materialize the automatic sheet feeding function (autosheet feeder function) as described above in such small space.

Now, in conjunction with FIG. 1, the description will be made of the arrangement of the mechanism unit 53 and base board 51 for controller for this ink jet recording apparatus. FIG. 1 is a perspective view of the apparatus drawn as being observed from its back face side. The mechanism unit 53 and base board 51 for controller should be electrically connected. This electrical connection is made by use of a flat cable 3 and cables 55 and 56. Also, as described later, the operational switches, indication LEDs, and others are installed on the panel board, but this panel board, and base board 51 for controller are connected by use of a card type cable 54 that has been processed in a given configuration.

With the sheet feeding mechanism structured as described above, the base board 51 for controller is arranged below the pressure board 8 formed in the slanting direction. In other words, the base board 51 for controller coupled with the shield board 52 is incorporated on the depth side (in the front direction in FIG. 1) of the lower case 18. Then, the structure is arranged to incorporate the mechanism unit 53 that comprises the pressure board 8 whose back face is slightly pushed out; the carriage 2; the frame 4; and others on the front side of the lower case 18 (in the depth direction in FIG. 1). After all, the structure is formed in such a manner as to three-dimensionally arrange the portion related to sheet feeding including the pressure board 8 on the back face of the mechanism unit 53, and the base board 51 for controller, that is, a part of the mechanism unit 53 and base board 51 for controller. In this way, the further miniaturization of the recording apparatus can be implemented.

Now, in conjunction with FIG. 2, the description will be made of the arrangement of components on the base board 51 for controller. Generally, a recording apparatus of the kind is provided with a power-supply circuit incorporated in it. For the recording apparatus of the present embodiment, too, a power-supply circuit is formed on the base board 51 for controller. In other words, on the base board 51 for controller, which is formed as a printed circuit board, there are arranged a power-supply connector 201 serving as the insertion port for the power-supply; various components of the power-supply circuit designated by numerical references 202 to 212; a connector 213 for interface use in order to receive recording signals from the external device; connectors 214 and 215 for connecting cables to the carriage driving motor and recording medium feeding motor; a connector 216 for coupling the flat cable terminal connected to the recording head unit; a CPU chip 217; a controlling memory 218; and a memory 219 for provisional storage. In the components of the power-supply circuit, large electrolyte capacitors 204 and 208, a troidal coil 205, a filter 203 or switching elements 206 and 207, and others are included. The controlling memory 218 is a ROM (read only memory) storing control program and others for use of the CPU chip 217, for example. The memory 219 for provisional storage is a DRAM (dynamic random access memory), for example.

In accordance with the present embodiment, the CPU chip 217 is arranged substantially in the center of the base board 51 for controller. The CPU chip 217 is provided with a central processing unit (CPU) and a considerable portion of required circuits in the form of one chip. With this one-chip formation, the area occupied by them on the base board becomes smaller significantly, hence largely contributing to the intended miniaturization. The CPU chip 217 is thin and formed substantially in square, which is typically formed by means of QFP (quad flat package). On each side thereof, many leads are arranged, respectively. The assignment of the leads to the CPU chip 217 is made so that each of the leads is orientated in the direction to the other elements to which each of the leads is related. For example, the leads related to the controlling memory 218 are arranged on the side A of the CPU chip 217 in FIG. 2 so as to orientate them toward the controlling memory 218. Likewise, the leads related to the memory 219 for provisional storage are arranged on the side C so that these leads are orientated toward the memory 219 for provisional storage. With the controlling memory 218 and the memory 219 for provisional storage being a ROM and a DRAM, respectively, it is necessary to install many wires for use of address/data buses between the CPU chip 217, controlling memory 218, and memory 219 for provisional storage. Therefore, unless care is given particularly to the arrangement of these wires, its drawing tends to become redundant, resulting in the scattered wiring patterns on the base board, and making it impossible to implement the intended miniaturization of the base board 51 for controller.

In accordance with the present embodiment, the controlling memory 218 and the memory 219 for provisional storage are arranged close to the sides A and C of the CPU chip 217, respectively, as shown in FIG. 2, for example. Further, among the leads on the CPU chip 217, those to be connected with the controlling memory 218 and the memory 219 for provisional storage are put together and arranged on the A side and C side, respectively. As a result, any redundant drawing of wiring patterns, such as being drawn from the C side to A side of the CPU chip 217, can be avoided, and the resultant length of wires can be shortened between the CPU and the controlling memory 218 and the memory 219 for provisional storage. In other words, the leads needed for a series of signals transmitted to one and the same external element are put together on the CPU chip, and then, structured so as to orientate them toward such external element. In this way, any redundant drawing of wiring patterns is prevented, thus producing favorable effects on miniaturizing the base board, particularly when making the width of its shorter side smaller.

Also, for the base board 51 for controller, the structure is made to arrange comparatively tall components, such as large electrolyte capacitors 204 and 205, troidal coil 205 and others, on the depth side (sheet feeding side) of the recording apparatus, while arranging those components whose height is lower on the front side (sheet exhausting side) of the recording apparatus. The components of the power-supply circuit and connectors for external use are generally large. Therefore, with respect to the connector 201 for power-supply use, electrolyte capacitors 204 and 208, troidal coil 205, filter 203, switching elements 206 and 207 or connector 213 for interface use, for example, there is no alternative but to use tall components. Here, as described earlier, the pressure board 8 is slantly arranged for sheet feeding above the base board 51 for controller, hence making it impossible to arrange the tall components on the front side of the recording apparatus. For the base board 51 for controller, therefore, it is structured to arrange the power-supply circuit on the left side toward the depth side of the recording apparatus, and then, arrange the connector 201 for power-supply use and electrolyte capacitors 204 and 208 accordingly, while arranging the interface circuit on the right side so as to provide the connector 213 for interface use on that side. In other words, the tall components are arranged on the portion where there is more distance to the pressure board 8 (that is, the portion having more clearance).

According to the conventional practice, it is necessary for a power-supply circuit to make the connecting wire/wiring pattern between components on the printed circuit board as short as possible, because the current running across the components is great. To satisfy this condition, the area for arranging the components of the power-supply circuit should be made as small as possible: for that matter, these components are usualy arranged on a circular or square area. In contrast to it, the base board 51 for controller of the present embodiment allows the components of the power-supply circuit to be arranged substantially in line along the longer side of the base board 51 for controller, thus effectively utilizing the space available in the recording apparatus for the attainment of the miniaturization of the recording apparatus. In this respect, however, it becomes particularly important to give serious consideration to the width of wiring patterns between the components as described below, because the components of the power-supply circuit are to be arranged substantially in line.

In general, a printed circuit board of the kind is structured by assembling components on the printed circuit board on which wiring patterns are formed. A wiring pattern is usually formed by patterning a copper foil of 18 $\mu$m thick in a desired configuration. As it can be assumed that the thickness of the wiring pattern and volume conductivity are constant, the electric resistance of the wiring pattern is determined by the width and length of the wiring pattern. Particularly, the electric resistance depends largely on the width of the wiring pattern. In order to operate a recording apparatus of the kind normally, while suppressing the heat generation of the wiring pattern, the electric resistance of the wiring pattern should be kept at values less than a specific level. As a practical problem, it is necessary to determine the width of the wiring pattern at a rate of 700 $\mu$m or more per running current of 1 A (ampere) between the components of the power-supply circuit whose running current is large. In accordance with the present embodiment, a current of maximum 3 A may be caused to flow. Therefore, the width of the wiring patterns of the power-supply circuit is made to be 3.1 mm or more even for the narrowest area where the patterns are arranged. Also, the components of the power-supply circuit should be arranged in line. Therefore, the length of the wiring patterns tends to be longer. The resistance becomes larger in proportion to the length, and the voltage drop becomes greater. It is, therefore, preferable to define the wiring width at the rate of 850 $\mu$m or more per ampere if the length of the wiring pattern (connection) becomes greater. Also, in consideration of influences exerted by temperatures, the formation of patterns, and others, it is more preferable to make the wiring width to be 1 mm or more per charged current of 1 A in order to secure more reliable operation.

With the structure described above, it is possible to arrange the base board 51 for controller below the pressure board 8 formed in the slanting direction: in other words, a part of the mechanism unit and the base board for controller can be arranged three-dimensionally in part, thus remarkably contributing to making the ink jet recording apparatus smaller. Also, for the reasons described above, the position of the interface connector 213, and the positions of the series of components of the power-supply circuit are determined by the arrangement configuration on the depth side of the recording apparatus. For example, the power-supply circuit is arranged on the left-hand side, while the interface circuit and interface connector 213 on the right-hand side as described earlier. To these circuits and components, signals are supplied from the CPU chip 217, and the lead lines of the CPU chip 217 are connected therewith. The lead lines related to these connections are arranged together on the CPU chip 217 side, and orientated toward these circuits and components. In other words, the lead lines related to the interface connector 213 of those lines of the CPU chip 217 are arranged on the right half of the side D thereof as shown in FIG. 2 so as to connect them with the interface connector 213 in a comparatively short distance. Also, the relationship between the CPU chip 217 and other circuit elements are the same as described earlier. With such arrangement mode, it is possible to prevent patterns from being drawn around wastefully, hence making the base board smaller, and in turn, attaining the miniaturization of the apparatus as a whole.

Figure 5:
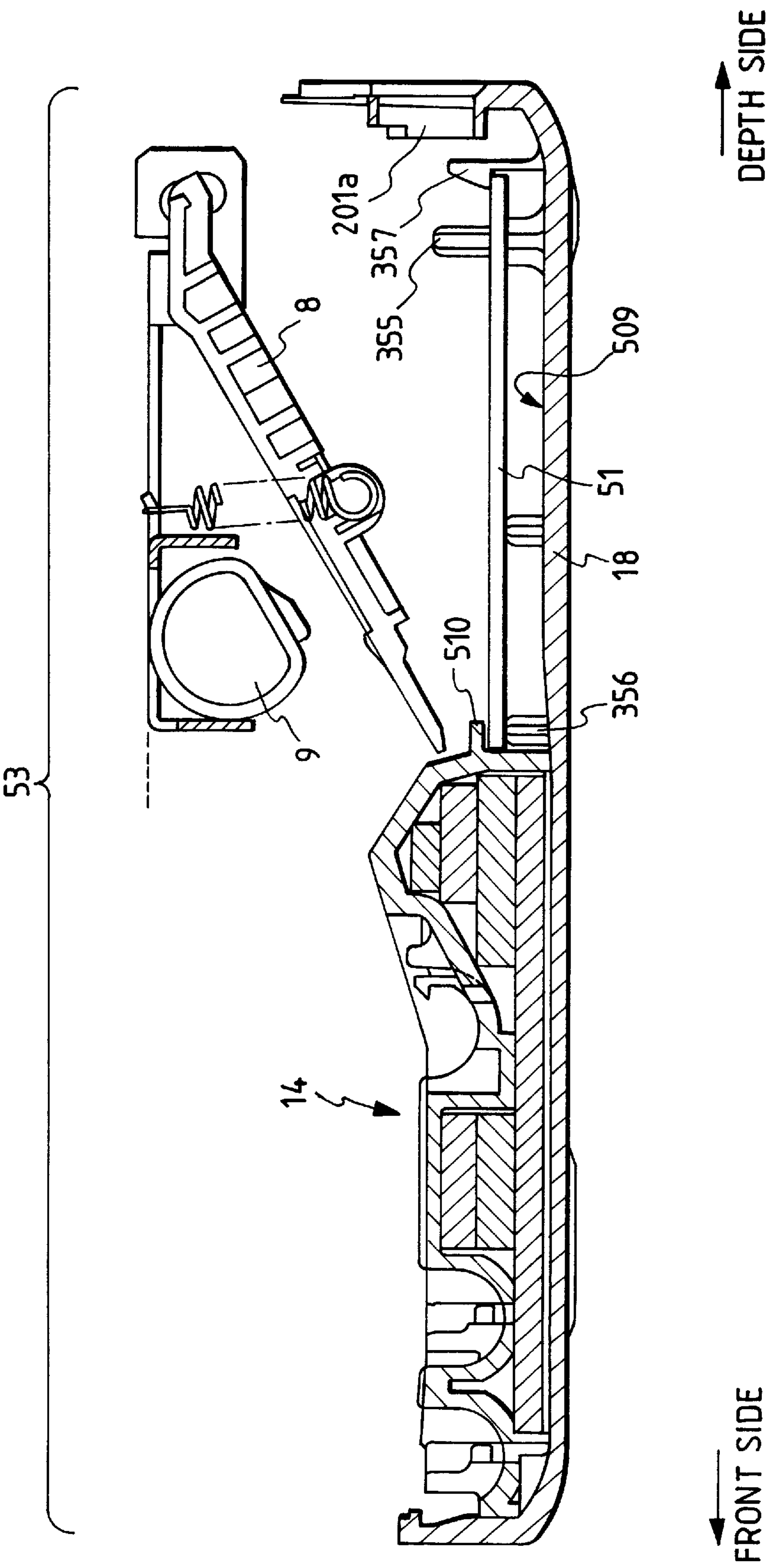
FIG. 5 is a cross-sectional view which shows the structure of principal part of the ink jet recording apparatus represented in FIG. 3.

FIG. 5 is a cross-sectional view of the ink jet recording apparatus observed from the frame 4 side (see FIG. 1). In FIG. 5, only the pressure board 8, the pickup roller 9, and base 14 are represented for the mechanism unit 53 in order to show the positional relationship clearer. Also, on the lower case 18, an opening of the power-supply connector 201, that is, the power-supply inlet port 201*a*, is provided. The base board 51 for controller is housed in the location of a flat portion 509 in the inner face of the lower case 18. More specifically, as shown in FIG. 5, a step 510 is arranged on the lower portion of the pressure board in the slanting direction in order to incorporate the base board in the lower case 18 of the recording apparatus unit without using any screws or other fixing means, but in the mode of being fixed by pressure exerted by means of the step 510 thus arranged and a nail 357 provided in the depth side of the lower case 18. Here, the bosses 355, 356, and 357 are integrally formed by resin formation together with the lower case 18. The bosses 355, 356, and 357 are also elastic. As a result, the base board 51 for controller is also fixed by the application of the elasticity of these bosses 355, 356, and 357.

With the arrangement of this structure, there is no need for the provision of screws and the bosses prepared for use of the screws, thus making it easier to assemble the base board for controller, while this structural arrangement contributes to saving space and to attaining the miniaturization of the apparatus eventually.

Figure 6:
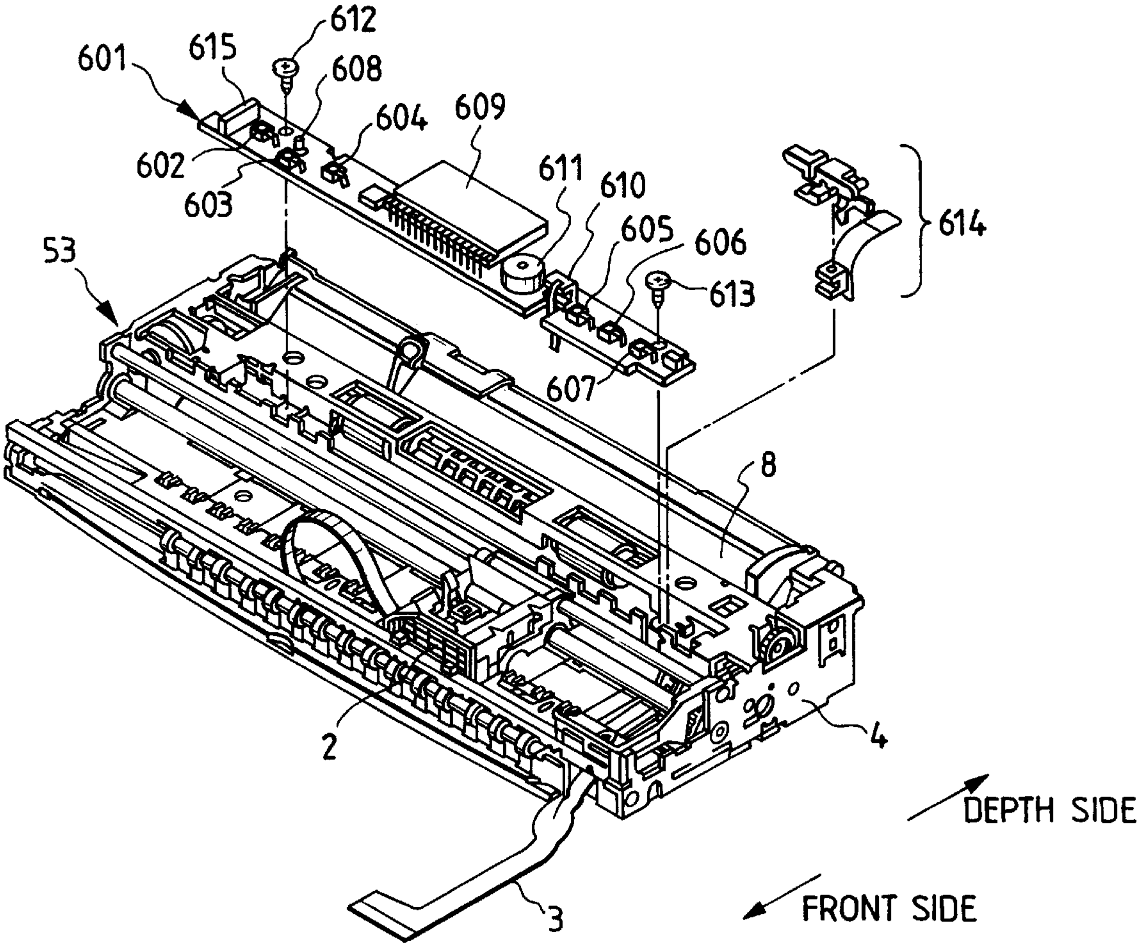
FIG. 6 is a perspective view which illustrates a panel board.
Figure 7:
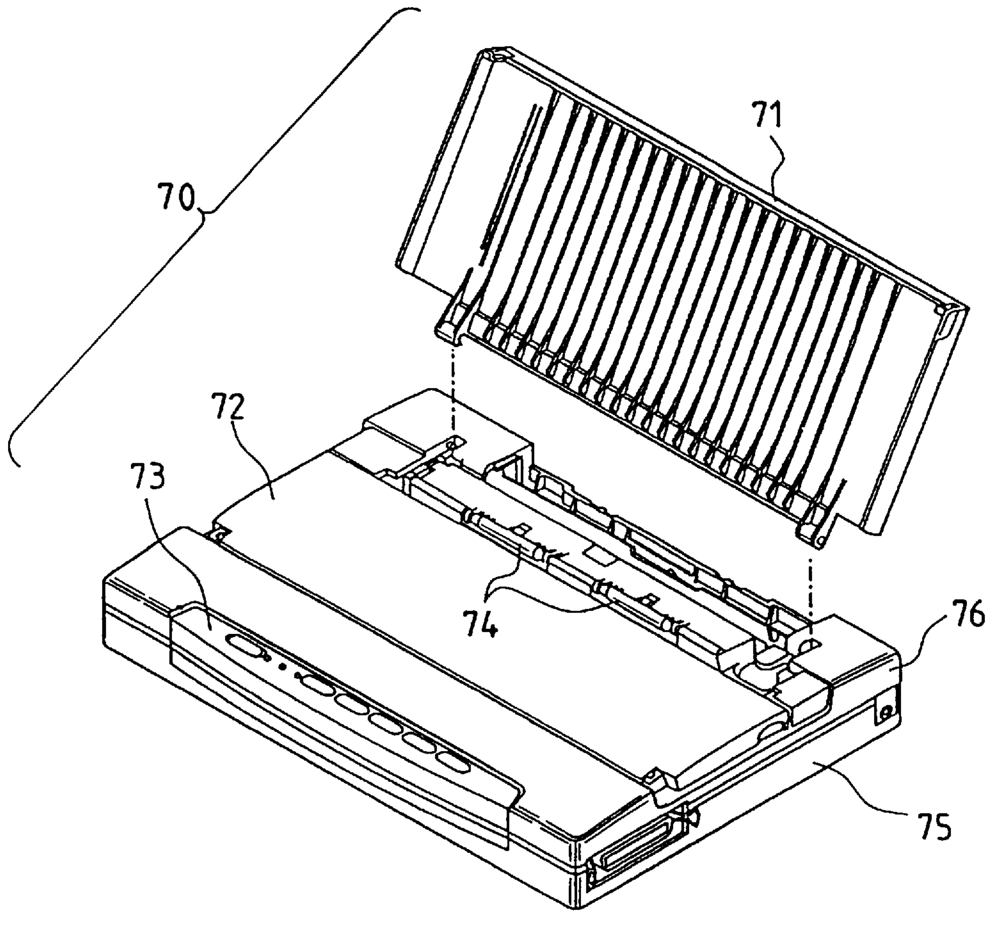
FIG. 7 PRIOR ART
FIG. 7 is a perspective view which shows the external appearance of one example of the conventional recording apparatus.
Figure 8:
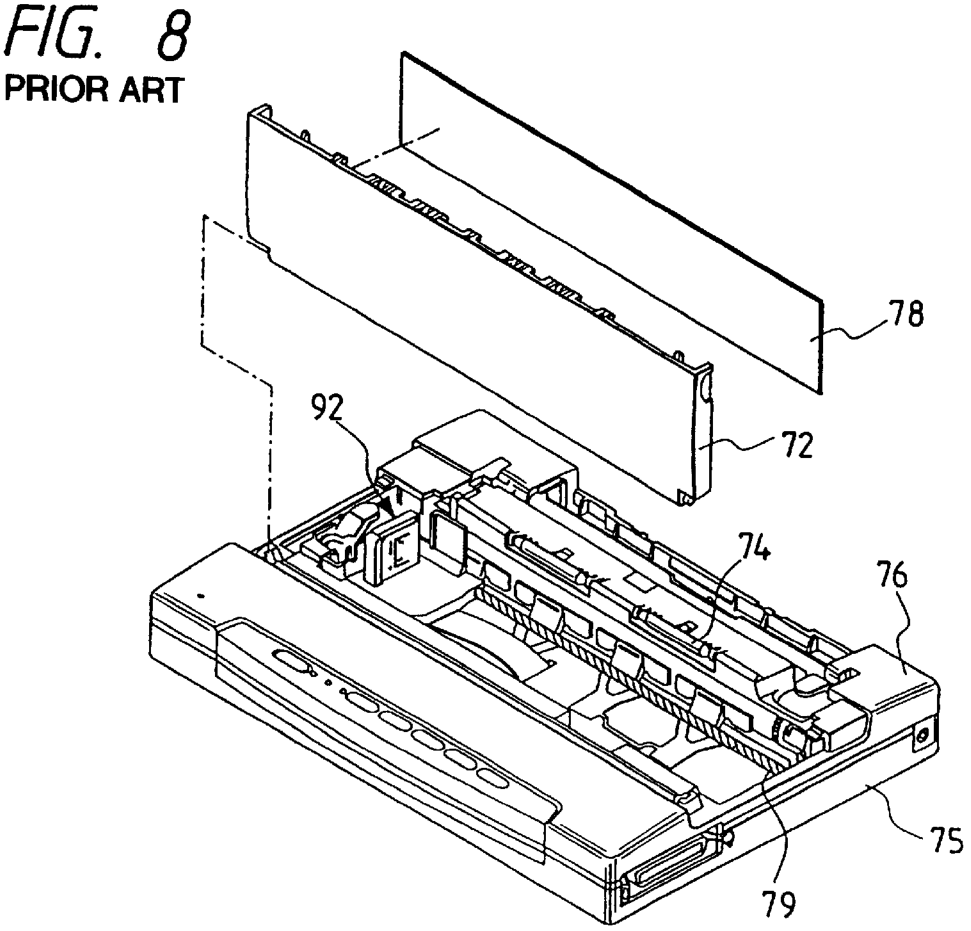
FIG. 8 PRIOR ART
FIG. 8 is a perspective view which shows a state where the cover of the apparatus represented in FIG. 7 is removed.
Figure 9:
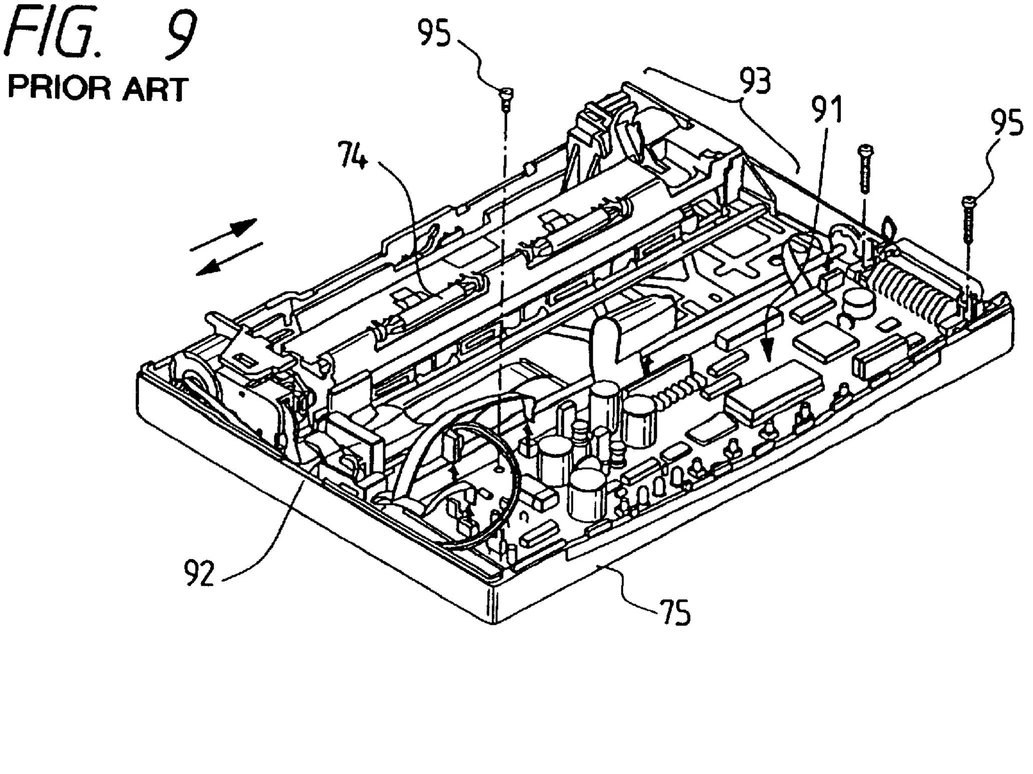
FIG. 9 PRIOR ART
FIG. 9 is a perspective view which shows a state where the upper case of the apparatus represented in FIG. 7 is removed.
Figure 10:
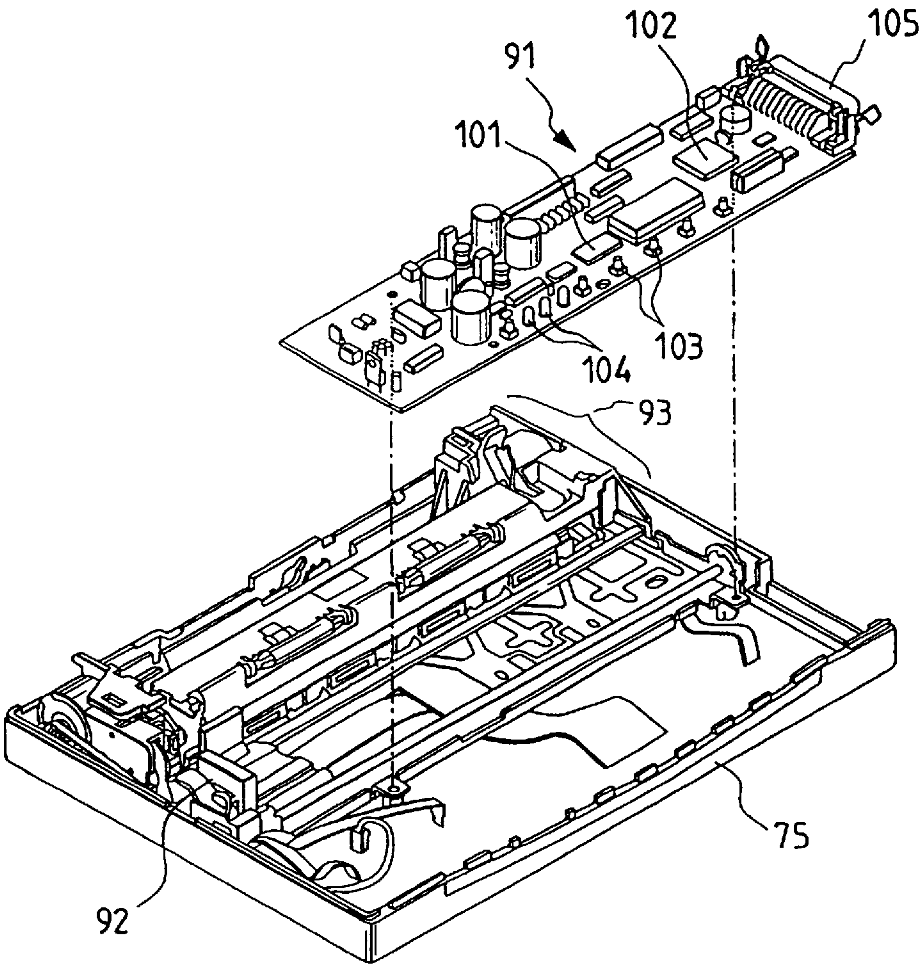
FIG. 10 PRIOR ART
FIG. 10 is a perspective view which shows a state where the base board for controller of the apparatus represented in FIG. 7 is removed.

Now, in conjunction with FIG. 6, the description will be made of the panel board on which are arranged switches and indication unit needed to operate the ink jet recording apparatus. On the panel board 601, switches 602 to 607, indication LED 608, indication panel 609, and buzzer 611 are installed. The structure is arranged to let the operator input his instructions, while indicating to or informing him of the information required by him. Further, on this panel board 601, are arranged a sheet absence sensor 610 that detects the presence and absence of a recording medium; a home position sensor 614 that detects whether or not the carriage 2 is in the home position; and a connector 615 for coupling the card type cable to the base board for controller. This panel board 601 is installed on the mechanism unit 53 by means of fixing screws 612 and 613.

This structure differs from that of the conventional recording apparatus in that such switches and indication members are arranged in the gap between the pressure board for carrying the recording medium, and the traveling area of the carriage, and then, the switches and indication members are installed on the panel board 601 serving as a child board, which is connected by a card type cable 54 (see FIG. 1) to the base board 51 for controller, a parents board, where CPU chips and others are installed. The location where the panel board 601 is arranged is in the recess on the mechanism unit 53. Here, by installing the panel board in such a manner, it is possible to implement another space saving.

In this respect, the description has been made of the present invention in accordance with the embodiment described above, wherein a printer is provided with a carriage having an ink jet recording head mounted thereon. However, with the arrangement of a scanner unit whose outer appearance is substantially the same as that of the ink jet recording head, it is possible to mount such scanner unit on the carriage compatibly with the ink jet recording head, hence allowing the apparatus to function as an information processing apparatus capable of reading image information from a source document supported by the platen of the apparatus. Even in such case, too, the structure described for the present invention is preferably applicable.

Further, the description has been made of the present invention by exemplifying an ink jet recording apparatus as its embodiment, but the present invention is not necessarily limited to the ink jet recording apparatus. It is also applicable to various other recording apparatuses of a thermal sensitive type, thermal transfer type or the like.

Moreover, as modes of recording apparatuses of the present invention, it may be possible to adopt a copying apparatus arranged in combination with a reader, and a facsimile apparatus provided with transmission and reception functions, in addition to such modes in which the recording apparatus is used individually or integrally as an image output terminal of a word processor, computer, or other information processing apparatus.

As described above, the embodiment of the present invention is such that a slanting portion is provided for the mechanism unit as a passage for carrying a recording medium, and then, a base board for controller is arranged in the space below this slanting portion. In this way, it is possible to utilize the space three-dimensionally and attain the miniaturization of a recording apparatus effectively. Also, facing such space, and in the direction substantially rectangular or transverse to the slanting portion that serves as the passage for carrying the recording medium, the components of the power-supply circuit are arranged substantially in line, thus enhancing the efficiency of space utilization for the attainment of the further miniaturization of the recording apparatus. Moreover, the width of wiring patterns between the components of the power supply circuit is defined at a given rate in accordance with the current passing the wiring patterns, hence making it possible to prevent any influence from being exerted by the voltage drop down.

What is claimed is:

1. A recording apparatus provided with a carriage that enables a recording head for recording on a recording medium to relatively travel with respect to the recording medium, a mechanism unit for driving said carriage and carrying said recording medium, and a power-supply circuit having components for supplying power to said recording head and said mechanism unit, said apparatus comprising:

a slanting portion arranged for said mechanism unit as a passage for carrying the recording medium, and in a space below said slanting portion, the components constituting said power-supply circuit being arranged substantially in line in a direction substantially transverse to said slanting portion.

2. A recording apparatus according to claim 1, wherein said power-supply circuit is formed on a printed circuit board, and a width of a wiring pattern between the components constituting said power-supply circuit is defined at a rate of 700 μm or more per current of 1 A passing through said wiring pattern.

3. A recording apparatus according to claim 1, wherein power-supply circuit is formed on a printed circuit board, and a width of a wiring pattern between the components constituting said power-supply circuit is defined at a rate of 850 μm or more per current of 1 A passing through said wiring pattern.

4. A recording apparatus according to claim 1, wherein said power-supply circuit is formed on a printed circuit board, and a width of a wiring pattern between the components constituting said power-supply circuit is defined at a rate of 1 mm or more per current of 1 A passing through said wiring pattern.

5. A recording apparatus provided with a carriage that enables a recording head for recording on a recording medium to relatively travel with respect to the recording medium, a mechanism unit for driving said carriage and carrying the recording medium, and a controller having a base board including a power-supply circuit, components constituting said power-supply circuit being arranged on one face of said base board, and being connected with each other by wiring patterns, said apparatus comprising:

a slanting portion arranged for said mechanism unit as a passage for carrying the recording medium, at least a part of said base board being arranged in a space below said slanting portion, wherein said components constituting said power-supply circuit are arranged substantially in line in a direction facing said space and substantially transverse to a slanting direction of said slanting portion, and a width of the wiring pattern between said components constituting said power-supply circuit is defined at a rate of 700 μm or more per current of 1 A passing through said wiring pattern.

6. A recording apparatus according to claim 5, wherein the width of said wiring pattern between said components constituting said power-supply circuit is defined at a rate of 850 μm or more per current of 1 A passing through said wiring pattern.

7. A recording apparatus according to claim 6, wherein the width of said wiring pattern between said components constituting said power-supply circuit is defined at a rate of 1 mm or more per current of 1 A passing through said wiring pattern.

8. A recording apparatus according to any one of claims 5 to 7, wherein a one-chip central processing unit chip is arranged substantially in the central portion of said base board.

9. A recording apparatus according to any one of claims 1 to 7, wherein said recording head is an ink jet recording head for discharging ink in accordance with signals.

10. A recording apparatus according to claim 9, wherein said recording head is provided with electro-thermal transducing elements for generating thermal energy to be used for discharging ink.

11. A recording apparatus according to claim 10, wherein said recording head discharges ink from discharge ports by utilization of film boiling created in the ink by application of the thermal energy by said electrothermal transducing elements.

* * * * *

UNITED STATES PATENT AND TRADEMARK OFFICE

CERTIFICATE OF CORRECTION

PATENT NO. : 5,831,656

DATED : November 3, 1998

INVENTOR(S) : CHOSA

It is certified that error appears in the above-identified patent and that said Letters Patent is hereby corrected as shown below:

COLUMN 3:

Line 41, "apparaatus" should read --apparatus--.

COLUMN 12:

Line 3, --a slanting direction of-- should be inserted before "said".

Signed and Sealed this

Twenty-ninth Day of June, 1999

Attest:

Q. TODD DICKINSON

*Attesting Officer*

*Acting Commissioner of Patents and Trademarks*